US006706585B2

(12) United States Patent
Uchiyama et al.

(10) Patent No.: US 6,706,585 B2
(45) Date of Patent: Mar. 16, 2004

(54) CHEMICAL VAPOR DEPOSITION PROCESS FOR FABRICATING LAYERED SUPERLATTICE MATERIALS

(75) Inventors: Kiyoshi Uchiyama, Colorado Springs, CO (US); Narayan Solayappan, Colorado Springs, CO (US); Carlos A. Paz de Araujo, Colorado Springs, CO (US)

(73) Assignees: Symetrix Corporation, Colorado Springs, CO (US); Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/405,309

(22) Filed: Apr. 2, 2003

(65) Prior Publication Data

US 2003/0203513 A1 Oct. 30, 2003

Related U.S. Application Data

(62) Division of application No. 09/521,094, filed on Mar. 7, 2000, now Pat. No. 6,562,678.

(51) Int. Cl.$^7$ ........................................... H01L 21/8242
(52) U.S. Cl. ..................... 438/240; 438/493; 438/935; 438/938; 438/763
(58) Field of Search ................................ 438/240, 493, 438/935, 938, 763, FOR 189, FOR 270, FOR 220, FOR 395, FOR 489

(56) References Cited

U.S. PATENT DOCUMENTS

| | | | |
|---|---|---|---|
| 5,046,043 A | | 9/1991 | Miller et al. |
| 5,128,316 A | * | 7/1992 | Agostinelli et al. ......... 505/237 |
| 5,241,191 A | * | 8/1993 | Agostinelli et al. ......... 505/329 |
| 5,434,102 A | | 7/1995 | Watanabe et al. |
| 5,439,845 A | * | 8/1995 | Watanabe et al. ........... 438/396 |
| 5,466,629 A | | 11/1995 | Mihara et al. |
| 5,468,684 A | | 11/1995 | Yoshimori et al. |
| 5,519,234 A | | 5/1996 | Paz de Araujo et al. |
| 5,523,964 A | | 6/1996 | McMillan et al. |
| 5,527,567 A | | 6/1996 | Desu et al. |
| 5,648,114 A | * | 7/1997 | Paz De Araujo et al. 427/126.3 |
| 6,080,592 A | | 6/2000 | Paz de Araujo et al. |
| 6,171,934 B1 | | 1/2001 | Joshi et al. |
| 6,303,391 B1 | * | 10/2001 | Hintermaier et al. .......... 438/3 |

FOREIGN PATENT DOCUMENTS

| | | |
|---|---|---|
| EP | 0716162 | 6/1996 |
| EP | 0781736 | 7/1997 |
| EP | 0732422 | 9/1998 |
| JP | 10183692 | 1/2000 |
| WO | WO 95/02897 | 1/1995 |
| WO | WO 99/02756 | 1/1999 |

OTHER PUBLICATIONS

T. Kijima, et al., "New Low Temperature ProcessingOf MOCVD–Bi4Ti3O12 Thin Films Using BIOx Buffer Layer", Extended Abstracts Of The International Conference On Solid State Devices And Materials, Japan Society Of Applied Physics, Tokyo, Japan, Sep. 1, 1997, pp. 44–45 XP000728018.

T. Kijima, et al., "Ultra–Thin Fatigue–Free Bi4Ti3O12 Films For Nonvolatile Ferroelectric Memories", Japanese Journal Of Applied Physics, Publication Office Japanese Journal Of Applied Physics, Tokyo, Japan, vol. 35, No. 28 Feb. 1, 1998, pp. 1246–1250, XP000573730.

\* cited by examiner

Primary Examiner—George Fourson
Assistant Examiner—Michelle Estrada
(74) Attorney, Agent, or Firm—Patton Boggs LLP

(57) ABSTRACT

A first reactant gas is flowed into a CVD reaction chamber containing a heated integrated circuit substrate. The first reactant gas contains a first precursor compound or a plurality of first precursor compounds, and the first precursor compound or compounds decompose in the CVD reaction chamber to deposit a coating containing metal atoms on the heated integrated circuit substrate. The coating is treated by RTP. Thereafter, a second reactant gas is flowed into a CVD reaction chamber containing the heated substrate. The second reactant gas contains a second precursor compound or a plurality of second precursor compounds, which decompose in the CVD reaction chamber to deposit more metal atoms on the substrate. Heat for reaction and crystallization of the deposited metal atoms to form a thin film of layered superlattice material is provided by heating the substrate during CVD deposition, as well as by selected rapid thermal processing ("RTP") and furnace annealing steps.

17 Claims, 7 Drawing Sheets

CHEMICAL VAPOR DEPOSITION PROCESS FOR FABRICATING LAYERED SUPERLATTICE MATERIALS

RELATED APPLICATIONS

This application is a divisional application of copending application Ser. No. 09/521,094 filed Mar. 7, 2000 now U.S. Pat. No. 6,562,678.

BACKGROUND OF THE INVENTION

1. Field of the Invention

The invention in general relates to the fabrication of layered superlattice materials, and more particularly to a chemical vapor deposition method for making thin films of layered superlattice materials, and to thin films of layered superlattice materials fabricated using such method.

2. Statement of the Problem

Ferroelectric compounds possess favorable characteristics for use in nonvolatile integrated circuit memories. See U.S. Pat. No. 5,046,043, issued Sep. 3, 1991, to Miller et al. A ferroelectric device, such as a capacitor, is useful as a nonvolatile memory when it possesses desired electronic characteristics, such as high residual polarization, good coercive field, high fatigue resistance, and low leakage current. Layered superlattice material oxides have been studied for use in integrated circuits. Layered superlattice materials exhibit characteristics in ferroelectric memories that are orders of magnitude superior to those of PZT and PLZT compounds.

U.S. Pat. No. 5,519,234, issued May 21, 1996, to Paz de Araujo et al., discloses that layered superlattice compounds, such as strontium bismuth tantalate (SBT), have excellent properties in ferroelectric applications as compared to the best prior materials and have high dielectric constants and low leakage currents. U.S. Pat. No. 5,434,102, issued Jul. 18, 1995, to Watanabe et al., and U.S. Pat. No. 5,468,684, issued Nov. 21, 1995, to Yoshimori et al., describe processes for integrating these materials into practical integrated circuits. Ferroelectric layered superlattice materials, like the metal oxides $SrBi_2Ta_2O_9$ (SBT) and $SrBi_2(Ta_{1-x}Nb_x)_2O_9$ (SBTN), where $0 \leq x \leq 1$, are currently under development for use as capacitor dielectric in nonvolatile memory applications, such as in FeRAMs and nondestructible read-out ferroelectric FETs.

The layered superlattice materials currently being considered for use are metal oxides. Thin films of layered superlattice materials may be formed on a substrate using one of a number of techniques known in the art. Conventional deposition techniques include, for example, sputtering, sol-gel or metal organic deposition ("MOD") techniques. The MOD techniques are preferred for various reasons, including stability of liquid precursor solutions, and good control of stoichiometry in the precursor streams and in the ferroelectric thin film. An MOD technique for depositing a thin film of superlattice material typically entails the decomposition of metal organic precursors to form a solid film of metal oxide compounds on an integrated circuit substrate, and the reaction and crystallization of the metal oxide compounds in the solid film to form the desired polycrystalline layered superlattice material. Formation of polycrystalline layered superlattice material is necessary in order to obtain desired ferroelectric polarizability. Reaction and crystallization to form polycrystalline ferroelectric layered superlattice material invariably requires one or more steps of heating the solid film.

A well-known category of techniques for depositing MOD precursors on integrated circuit substrates is chemical vapor deposition ("CVD"). CVD techniques are well-suited for small geometries and for achieving highly conformal structures in integrated circuits. In a CVD process, a gaseous stream containing metal organic precursor compounds is brought into contact with the heated surface of the substrate, which causes the metal organic precursor compounds to decompose at the substrate surface and form a solid film of metal-containing compounds.

In typical MOD-CVD fabrication of layered superlattice materials, reaction and crystallization of the deposited metal compounds to produce desired electronic properties requires heat treatments in oxygen gas at elevated temperatures. This heating is commonly referred to as annealing. Annealing at elevated temperature causes reaction of the deposited metal compounds and crystallization to form polycrystalline layered superlattice material. The annealing steps in the presence of oxygen are typically performed at a temperature in the range of 800° C. to 900° C. for 30 minutes to two hours. As a result of the presence of reactive oxygen at elevated temperatures, numerous defects, such as dangling bonds, are generated in the single crystal structure of the semiconductor substrate, leading to deterioration in its electronic characteristics. Annealing at elevated temperature for extended time may also damage other components of the integrated circuit, for example, diffusion barrier layers, which begin to degrade at temperatures of 700° C. and above.

The polarizability of ferroelectric layered superlattice material is affected by, among other factors, the grain size of the numerous crystal grains in the polycrystalline ferroelectric material. In the layered superlattice materials, it is believed that relatively large grain size enhances polarizability. Thin films of layered superlattice material formed using conventional CVD techniques, however, tend to have smaller grain size, resulting in decreased ferroelectric polarizability.

A persistent problem in dielectric and ferroelectric materials used in integrated circuits is charge dissipation and leakage current. It is believed that a significant part of leakage current travels along the grain boundaries of the crystal grains in polycrystalline dielectric and ferroelectric material.

Solution

The present invention provides a chemical vapor deposition ("CVD") method for fabricating ferroelectric layered superlattice materials in ferroelectric integrated circuits that minimizes the time of exposure to oxygen at elevated temperature, thereby reducing heat and oxidation damage. A CVD method in accordance with the invention produces relatively large grain size in the layered superlattice material, thereby enhancing ferroelectric polarizability. Further, a CVD method in accordance with the invention increases the path length of leakage charges in polycrystalline layered superlattice material, thereby reducing overall leakage current.

The layered superlattice materials, also referred to in the art as layered perovskite-like structures, are represented by the general formula:

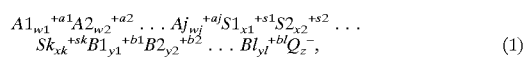
(1)

where A1, A2, . . . Aj represent A-site elements in the perovskite-like structure, which may be elements such as strontium, calcium, barium, bismuth, lead, and others; S1, S2 . . . Sk represent superlattice generator elements, which usually is bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in Formula (1) indicate the valences of the respective elements. For example, if Q is O for oxygen, then q is 2. The subscripts indicate the number of moles of the material in a mole of the compound, or in terms of the unit cell, the number of atoms of the element, on the average, in the unit cell. The subscripts can be integer or fractional. That is, Formula (1) includes the cases where the unit cell may vary throughout the crystalline material, e.g. in $SrBi_2(Ta_{0.75}N_{0.25})_2O_9$, on the average, 75% of the B-sites are occupied by a tantalum atom and 25% of the B-sites are occupied by a niobium atom. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although Formula (1) is written in the more general form since the invention is intended to include the cases where the A- and B-sites and the superlattice generator sites of the crystalline material can be occupied by more than one type of atom.

The value of z is found from the equation:

$$(a1w1+a2w2 \ldots +ajwj)+(s1x1+s2x2 \ldots +skxk)+(b1y1+b2y2 \ldots +blyl)=qz.$$

Formula (1) includes all three of the Smolenskii type compounds discussed in U.S. Pat. No. 5,519,234, issued May 21, 1996, to Paz de Araujo et al. The layered superlattice materials do not include every material that can be fit into the Formula (1), but only those which spontaneously form themselves into crystalline structures with distinct alternating layers. For example, the layered superlattice material strontium bismuth tantalate, represented by the stoichiometric formula $SrBi_2Ta_2O_9$, may be viewed as crystalline layers of bismuth oxide alternating with perovskite-like layers containing strontium and tantalum.

Embodiments of a method in accordance with the invention generally provide for flowing a first reactant gas into a CVD reaction chamber containing a heated integrated circuit substrate. The first reactant gas contains a first precursor compound or a plurality of first precursor compounds, and the first precursor compound or compounds decompose in the CVD reaction chamber to deposit a coating containing metal atoms on the heated integrated circuit substrate. Thereafter, a second reactant gas is flowed into a CVD reaction chamber containing the heated substrate. The second reactant gas contains a second precursor compound or a plurality of second precursor compounds, which decompose in the CVD reaction chamber to deposit more metal atoms on the substrate. Heat for reaction and crystallization of the deposited metal atoms is provided by heating the substrate during CVD deposition, as well as by selected rapid thermal processing ("RTP") and furnace annealing steps. The temperature of the heated substrate and the sequence and temperature of the treating steps may vary in the general embodiments of a method in accordance with the invention.

In a first generalized embodiment, the first reactant gas decomposes and a seed layer is deposited on the heated substrate. The temperature of the heated substrate is at a first substrate temperature in the range of from 400° C. to 700° C. The seed layer comprises metal atoms, usually in the form of metal-oxide compounds; however, these metal oxides are not necessarily the desired layered superlattice material compound. In this embodiment, it is typically necessary to treat the seed layer using RTP for reaction and crystallization of the deposited metal oxides to occur and to form the desired layered superlattice material in the seed layer. Treating of the seed layer may also include a furnace anneal. The seed layer is typically very thin, in the range of from 5 nm to 40 nm, preferably about 25 nm. Therefore, reaction and crystallization of the deposited metal compounds of the seed layer by RTP to form crystalline layered superlattice material is faster and more complete than in thicker films having thicknesses in the range of from 100 nm to 400 nm. Optional treating of the seed layer by heating in a furnace annealing step enhances desired crystallization of the layered superlattice material in the seed layer.

In accordance with the invention, when the second reactant gas reacts in a CVD reaction chamber to deposit a second coating of metal oxide on the seed layer, the presence of crystals in the seed layer enhances the formation of a thin film of polycrystalline layered superlattice material. The presence of the seed layer makes it possible to form polycrystalline layered superlattice material using less exposure to heating at elevated temperatures than necessary with conventional CVD techniques, while obtaining large grain size and good electronic properties. The heated substrate alone at a second substrate temperature in the range of from 400° C. to 700° C. usually provides sufficient heating for reaction and crystallization of the metal atoms deposited in the second coating to form the final thin film of layered superlattice material. Additional treatment of the substrate by RTP and furnace anneal may be conducted, however, after deposition of the second coating.

In the first embodiment, the seed layer is typically a fairly continuous and uniformly thick layer, preferably about 25 nm thick. In a second general embodiment, the seed layer formed by the first reactant gas may, however, comprise "islands" of layered superlattice material, rather than a continuous layer. Based on deposition rates known from depositing thicker layers, an amount of first precursor compounds corresponding to a layer having a "nominal thickness" in the range of from 5 nm to 25 nm, preferably about 10 nm, is flowed into a CVD reaction chamber. Because the amounts are so small, uneven deposits of metal-containing compounds are deposited as islands of material on the substrate, instead of a smooth, uniform coating. The thickness is referred to as a "nominal thickness" because its thickness is uneven and not practically measurable. The volume of the deposited seed layer corresponds to an amount deposited in a given time period at a known average rate of deposition, even though the amount is not evenly distributed. At a first substrate temperature in the range of from 600° C. to 700° C., the heated substrate alone usually provides sufficient heating for reaction and crystallization of the metal compounds initially deposited in the islands, forming layered superlattice material. The optional treatment by RTP and by furnace anneal enhances formation of islands of crystalline layered superlattice material in the seed layer. During flowing of the second reactant gas into the CVD reaction chamber, the substrate is heated at a second substrate temperature that is from 10° C. to 100° C. lower than the first substrate temperature. When the second reactant gas decomposes and deposits metal compounds on the heated substrate, crystalline growth occurs only at the crystalline island surfaces of the seed layer, resulting in large grain size in the final thin film of polycrystalline layered superlattice material. In this embodiment, no treating of the seed layer is required before flowing the second reactant gas. Treating by RTP or furnace anneal may optionally be conducted before or after reaction of the second reactive gas to enhance formation of layered superlattice material.

In the first and second embodiments discussed already, the first reactant gas and second reactant gas usually have identical or similar compositions, containing the same precursor compounds for forming the desired thin film of layered superlattice material. The first reactant gas may, however, contain only superlattice-generator metals, usually bismuth, so that the seed layer or islands of crystalline material formed in the seed layer contain bismuth oxide only. In these variations also, the presence of the crystallized seed layer of bismuth oxide functions to enhance the reaction and crystallization of the metal compounds deposited from the second reactant gas.

In a third generalized embodiment of a method in accordance with the invention, a coating of metal atoms is deposited using CVD by flowing a first reactant gas and a second reactant gas into a CVD reaction chamber containing a heated substrate. The first reactant gas contains one or more precursor compounds containing superlattice-generator-elements, and the second reactant gas contains one or more precursor compounds containing perovskite-like-layer forming elements, that is, the A- and B-site elements in Formula 1, above. The temperature of the heated substrate is in the range of from 400° C. to 700° C., preferably in the range of from 600° C. to 700° C. The first reactant gas and second reactant gas are flowed into the CDV reaction chamber for a first predetermined time period, sufficient to deposit an initial coating on the substrate having a thickness or nominal thickness in the range of from 5 nm to 40 nm. The first predetermined time period is based on the average rate of deposition known from previous depositions of layers with a measured thickness. The first predetermined time period is typically in a range of from 10 seconds to 10 minutes, usually 30 seconds to 60 seconds. Then the flow of the second reactant gas, containing perovskite-like-layer-forming atoms, is interrupted for a second predetermined time period, sufficient to deposit a coating containing a metal compound containing atoms of a superlattice-generator element, but no A- or B-site elements. The second predetermined time period is also based on an average rate of deposition known from previous depositions of layers with a measured thickness. The first predetermined time period and the second predetermined time period are usually in the range of from 10 seconds to 10 minutes, preferably in the range of from 30 seconds to 60 seconds. After the second predetermined time period, the flow of the second reactant gas resumes for a third predetermined time period, preferably 30 seconds to 60 seconds. The sequence may be repeated any number of times until the aggregate of the sequential coatings reaches the desired thickness of the thin film. When the temperature of the heated substrate is higher, in the range of from 600° C. to 700° C., then the temperature is usually sufficient for the metal oxides in the coatings to react and to crystallize, forming the desired layered superlattice material. Optional treating of the seed layer by heating in an annealing step, such as with RTP or furnace annealing, enhances reaction and crystallization. The temperature of the heated substrate during CVD deposition during the various time periods may also be in a lower range of from 400° C. to 600° C. In this variation of an embodiment in accordance with the invention, it is typically advantageous to treat the deposited aggregate coating using RTP for reaction and crystallization of the deposited metal oxides to occur and to form the desired thin film of layered superlattice material. Treating of the final thin film may also include a furnace anneal.

Typically, in this third general embodiment, the superlattice-generator element in the first reactant gas is bismuth. By interrupting the flow of the second reactant gas, which contains perovskite-like-layer forming atoms, and continuing the flow of the first reactant gas into the CVD reaction chamber, grain boundaries between individual crystal grains are increased in volume and become more circuitous. The leakage path of leakage current thereby becomes longer, resulting in reduced leakage current through the ferroelectric or dielectric thin film. A variation of this embodiment further includes interrupting the flow also of the first reactant gas during the second predetermined time period, and then resuming flow of the first reactant gas at the end of the second predetermined time period.

It is a feature of the invention that thin films of layered superlattice material fabricated by methods in accordance with the invention have improved electronic properties, such as increased ferroelectric polarizability and reduced leakage current, even though the physical crystalline structure of the thin film may not be easily distinguishable from thin films of layered superlattice material fabricated using conventional methods of the prior art. The invention includes, therefore, integrated circuits containing thin films of layered superlattice material fabricated using a method in accordance with the invention, as well as the methods disclosed.

Numerous other features, objects and advantages of the invention will become apparent from the following description when read in conjunction with the accompanying drawings.

DESCRIPTION OF THE PREFERRED EMBODIMENT

1. Overview

Figure 1:
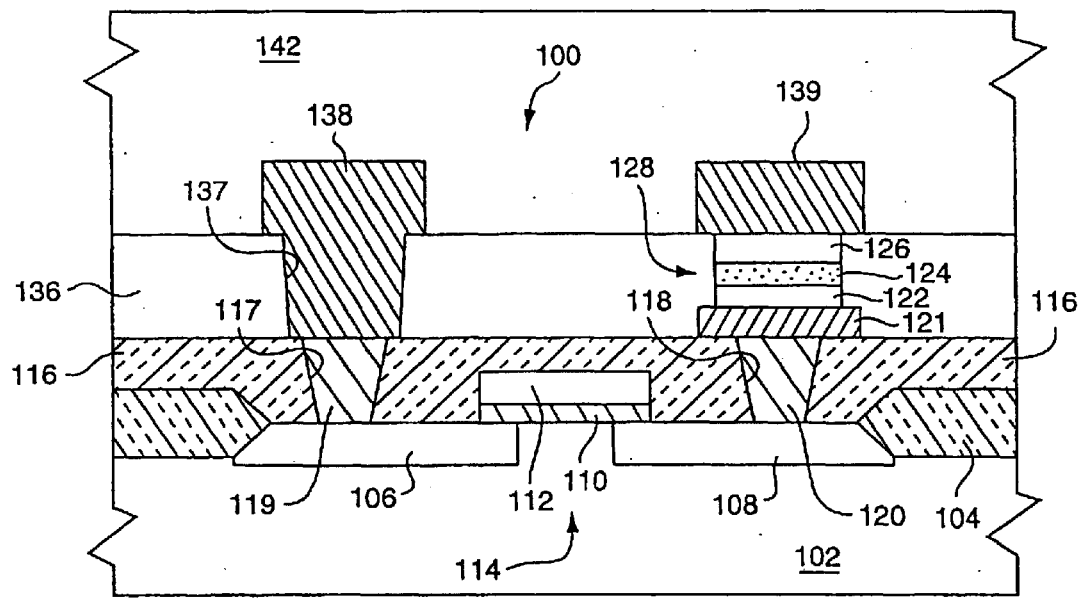
FIG. 1 is a schematic of a cross-sectional view of a portion of an integrated circuit as may be fabricated using a method in accordance with the invention showing a nonvolatile ferroelectric memory cell in which a ferroelectric memory capacitor is located above the switch.
Figure 2:
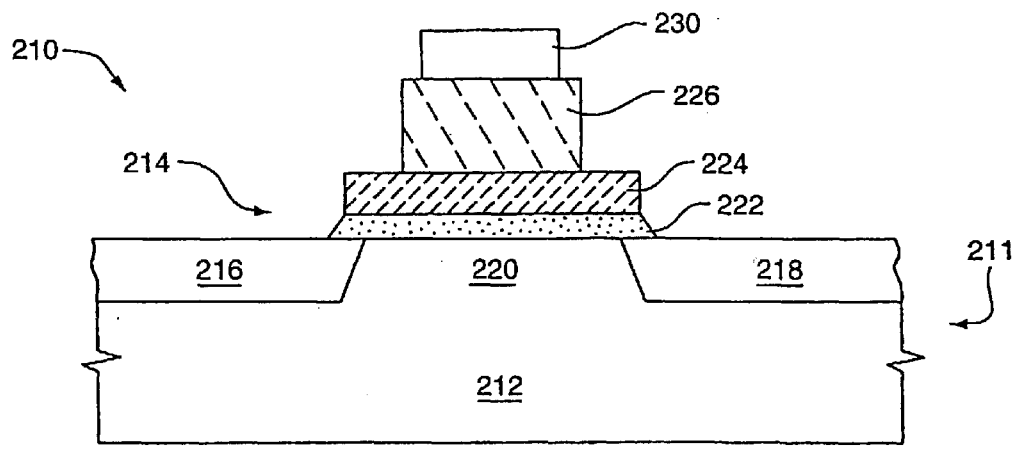
FIG. 2 shows a cross-sectional view of a portion of a ferroelectric FET memory that may be fabricated using a method in accordance with the invention.

It should be understood that the FIGS. 1 and 2, depicting integrated circuit devices, are not meant to be actual plan or cross-sectional views of any particular portion of actual integrated circuit devices. In actual devices, the layers will not be as regular and the thicknesses may have different proportions. The various layers in actual devices often are curved and possess overlapping edges. The figures instead show idealized representations which are employed to explain more clearly and fully the method of the invention than would otherwise be possible. Also, the figures represent only one of innumerable variations of ferroelectric devices that could be fabricated using the method of the invention. For example, FIG. 1 depicts a ferroelectric memory containing a switch in the form of a field effect transistor in electrical connection with a ferroelectric capacitor. Although the ferroelectric element depicted in FIG. 1 is substantially above the switch element, the invention may be used, for example, to fabricate a thin film of layered superlattice material in an element displaced to the side of the switch. In addition, a method in accordance with the invention may also be used to fabricate a ferroelectric FET memory in which the ferroelectric element comprising layered superlattice material is incorporated in the switch element. Such a ferroelectric FET, as depicted in FIG. 2, was described in U.S. Pat. No. 5,523,964, issued Jun. 4, 1996, to McMillan et al., which is hereby incorporated by reference as though fully disclosed herein.

FIG. 1 shows a cross-sectional view of an exemplary nonvolatile ferroelectric memory 100 fabricated in accordance with the invention. The general manufacturing steps for fabricating integrated circuits containing MOSFETs and ferroelectric capacitor elements are described in U.S. Pat. No. 5,466,629, issued Nov. 14, 1995, to Mihara et al., and U.S. Pat. No. 5,468,684, issued Nov. 21, 1995, to Yoshimori et al., which are hereby incorporated by reference as if fully disclosed herein. General fabrication methods have been described in other references also. Therefore, the elements of the circuit of FIG. 1 will be simply identified here.

In FIG. 1, a field oxide region 104 is formed on a surface of a silicon substrate 102. A source region 106 and a drain region 108 are formed separately from each other within silicon substrate 102. A gate insulating layer 110 is formed on the silicon substrate 102 between the source and drain regions 106 and 108. Further, a gate electrode 112 is formed on the gate insulating layer 110. These source region 106, drain region 108, gate insulating layer 110 and gate electrode 112 together form a MOSFET 114 switch.

A first interlayer dielectric layer (ILD) 116 made of BPSG (boron-doped phospho-silicate glass) is formed on substrate 104 and field oxide region 102. ILD 116 is patterned to form vias 117, 118 to source region 106 and drain region 108, respectively. Vias 117, 118 are filled to form plugs 119, 120, respectively. Plugs 119, 120 are electrically conductive and typically comprise polycrystalline silicon. A diffusion barrier layer 121 is formed and patterned on ILD 116 to be in electrical contact with plug 120. The diffusion barrier layer 121 is made of, for example, titanium nitride, and typically has a thickness of 10 nm to 20 nm. Diffusion barrier layers, such as titanium nitride, inhibit the diffusion of chemical species between the underlying and overlying layers of the memory 100.

As depicted in FIG. 1, a bottom electrode layer 122 made of platinum and having a thickness of 100 nm is deposited on diffusion barrier layer 121. Then a ferroelectric thin film 124 of layered superlattice material is formed in accordance with the invention on bottom electrode layer 122. A top electrode layer 126, made of platinum and having a thickness of 100 nm, is formed on ferroelectric thin film 124. Bottom electrode layer 122, ferroelectric thin film 124 and top electrode layer 126 together form ferroelectric capacitor 128.

Wafer substrate 102 may comprise silicon, gallium arsenide or other semiconductor, or an insulator, such as silicon dioxide, glass or magnesium oxide (MgO). The bottom and top electrodes of ferroelectric capacitors conventionally contain platinum. It is preferable that the bottom electrode contains a non-oxidized precious metal such as platinum, palladium, silver, and gold. In addition to the precious metal, metal such as aluminum, aluminum alloy, aluminum silicon, aluminum nickel, nickel alloy, copper alloy, and aluminum copper may be used for electrodes of a ferroelectric memory. Adhesive layers (not shown), such as titanium, enhance the adhesion of the electrodes to adjacent underlying or overlying layers of the circuits.

A second interlayer dielectric layer (ILD) 136 made of NSG (nondoped silicate glass) is deposited to cover ILD 116, diffusion barrier layer 121, and ferroelectric capacitor 128. A PSG (phospho-silicate glass) film or a BPSG (boron phospho-silicate glass) film could also be used in layer 136.

ILD 136 is patterned to form a via 137 to plug 119. A metallized wiring film is deposited to cover ILD 136 and fill via 137 and then patterned to form plug 137, source electrode wiring 138 and top electrode wiring 139. Wirings 138, 139 preferably comprise Al—Si—Cu standard interconnect metal with a thickness of from about 200 nm to 300 nm.

FIG. 2 shows a cross-sectional view of a portion of a ferroelectric FET memory 210 as may be fabricated using a method in accordance with an embodiment of the invention. The ferroelectric FET memory 210 is formed on a wafer 211, comprising a standard semiconductor material 212, preferably a p-100 silicon material. A semiconductor substrate 214 comprises a highly doped source region 216 and a highly doped drain region 218, which are formed about a doped channel region 220. Doped source region 216, drain region 218 and channel region 220 are preferably n-type doped regions. Semiconductor substrate 214 typically also includes a gate oxide 222, usually located above channel region 220, but which can extend beyond channel region 220 to cover parts of source region 216, drain region 218 and other parts of substrate 212. Typically, gate oxide 222 is a natural oxide that is formed from the semiconductor material 212 during high temperature process steps. When the semiconductor material 212 is silicon, then gate oxide 222 comprises silicon dioxide. An interface insulator layer 224 may be formed above semiconductor substrate 214 above channel 220, usually on gate oxide 222. A ferroelectric thin film 226, formed in accordance with the invention, is located above interface insulator layer 224 and channel region 218, usually on interface insulator layer 224. Gate electrode 230 is formed above ferroelectric thin film 226, usually on ferroelectric thin film 226. Semiconductor substrate 214, including source region 216, drain region 218, channel region 220, and gate oxide 222, together with interface insulator layer 224, ferroelectric thin film 226 and gate electrode 230 form ferroelectric FET memory 210. Typically, memory 210 is covered by an interlayer dielectric ("ILD"), comprising a glasseous oxide, preferably a boron-doped phosphosilicate glass ("BPSG"). For purposes of simplicity and clarity, the ILD and some other structural elements and insulating layers are not shown because they are well-known in the art.

Currently, ferroelectric layered superlattice materials, like the metal oxides $SrBi_2Ta_2O_9$ (SBT), $SrBi_2(Ta_{1-x}Nb_x)_2O_9$ (SBTN), where $0 \leq x \leq 1$, and particularly $Sr_aBi_b(Ta_cNb_d)O_{[9+(a-1)+(b-2)(1.5)+(c+d-2)(2.5)]}$, where $0.8 \leq a \leq 1$, $2 \leq b \leq 2.2$, $0 \leq d \leq 1$ and $1.9 \leq (c+d) \leq 2.1$ (SBTN), are being used and are under further development for use as capacitor dielectric in nonvolatile memory applications, such as in FeRAMs and nondestructible read-out ferroelectric FETs. Polycrystalline thin films of these layered superlattice materials, as well as other layered superlattice materials represented by Formula (1) may be fabricated and used in accordance with the invention.

The word "substrate" can mean the underlying semiconductor material 102 on which the integrated circuit is formed, as well as any object on which a thin film layer is deposited. In this disclosure, "substrate" shall generally mean the object to which the layer of interest is applied. For example, when we are talking about a ferroelectric thin film 124 of FIG. 1, the substrate on-which it is formed may include various elements, in particular, bottom electrode 122. The term "semiconductor substrate" is more specific than substrate. For example, as used in FIG. 2, "semiconductor substrate 214" refers to those elements of the circuit having origins in the original semiconductor material of the starting wafer, such as from the p-100 crystalline silicon material 212 of FIG. 2. Thus, in the example of the structure of FIG. 2, "semiconductor substrate 214" includes elements 212, 216, 218, 220.

The long dimensions of semiconductor substrate 214 and semiconductor material 102 define planes that are considered to be a "horizontal" plane herein, and directions perpendicular to this plane are considered to be "vertical". The terms "lateral" or "laterally" refer to the direction of the flat plane of the semiconductor substrate, that is, parallel to the horizontal direction.

Terms of orientation herein, such as "above", "top", "upper", "below", "bottom" and "lower", mean relative to the substrate 102, 214. That is, if a second element is "above" a first element, it means it is farther from the semiconductor substrate 102, 214; and if it is "below" another element then it is closer to the semiconductor substrate 102, 214 than the other element. Terms such as "above" and "below" do not, by themselves, signify direct contact. However, terms such as "on" or "onto" do signify direct contact of one layer with an underlying layer.

The term "thin film" is used herein as it is used in the integrated circuit art. Generally, it means a film of less than a micron in thickness. The thin films disclosed herein are typically less than 500 nm in thickness. A thin film of layered superlattice material fabricated by a method in accordance with the invention typically has a final thickness in a range of from 50 nm to 500 nm, preferably in a range of from 100 nm to 300 nm. These thin films of the integrated circuit art should not be confused with the layered capacitors of the macroscopic capacitor art which are formed by a wholly different process that is incompatible with the integrated circuit art.

The term "stoichiometric" herein may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice-occupied, though in actual practice there always will be some defects in the crystal at room temperature. For example, both $SrBi_2(TaNb)O_9$ and $SrBi_2(Ta_{1.5}Nb_{0.5})O_9$ are balanced stoichiometric formulae. In contrast, a precursor for strontium bismuth tantalum niobate in which the molar proportions of strontium, bismuth, tantalum, and niobium are 0.9, 2.18, 1.5, and 0.5, respectively, is represented herein by the unbalanced "stoichiometric" formula $Sr_{0.9}Bi_{2.18}(Ta_{1.5}Nb_{0.5})O_9$, since it contains excess bismuth and deficient strontium relative to the B-site elements tantalum and niobium.

A "precursor compound" in this disclosure refers to a metal organic compound containing at least one metal that is included in the desired layered superlattice material of the thin film formed in accordance with the invention. The metal organic precursor compounds disclosed herein are useful because they can be easily dissolved in organic liquid precursor solutions, which can be stored until used. In a preferred CVD method in accordance with the invention, one or more liquid precursor solutions are vaporized to form a reactant gas that contains precursor compounds suitable for formation of the desired thin film. The composition of a precursor solution may be described in two ways. The actual dissolved metal organic precursor compounds (solutes) and solvents and concentrations may be specified; or, for the sake of clarity, the stoichiometric formula representing the composition of the final oxide compound to be formed with the precursor may be specified. Similarly, a precursor compound may be described using its name or stoichiometric formula, or it may simply be identified by the metal atoms it contains.

Metal organic precursor compounds and liquid precursor solutions used in accordance with the invention can be manufactured reliably. Their composition can be easily controlled and varied, if necessary. They can be safely stored for long periods, up to six months. They are relatively nontoxic and nonvolatile, compared with many precursors of the prior art. Thin film layers formed in accordance with the invention have smooth, continuous and uniform surfaces, and they can be reliably fabricated to have thicknesses in the range of from 5 nm to 500 nm, maintaining important structural and electrical characteristics.

It should be understood that the specific processes and electronic devices described herein are exemplary; that is, the invention contemplates that the layers in FIGS. 1 and 2 may be made of many other materials than those mentioned above and described below. There are many other variations of the method of the invention than can be included in a document such as this, and the method and materials may be used in many other electronic devices other than integrated circuit devices 100 and 210.

2. Detailed Description of the Fabrication Process

A feature of the invention is that many different possible precursor compounds may be used in the CVD reaction chamber for the chemical vapor deposition of metal compounds on the heated substrate. Sometimes the use of a methoxide, for example, for one metal, and the use of a propoxide, for example, for another metal gives better results. Typical chemistry families that may be used as precursors are the alkoxides which include: methoxide. $[M(OCH_3)_n]$, ethoxide $[M(OC_2H_5)_n]$, propoxide $[M(OC_3H_7)_n]$, and butoxide $[M(OC_4H_9)_n]$, where M is a metal and n is the number of alkoxyl bases combining with the metal and is equal to the valence of the metal. A polymerized alkoxide can also be used. A preferable length of the alkoxide polymer chain is between 1 monomer units and 5 monomer units. Other chemistry families among many that may be used are the beta-diketonates, such as acetylacetonates and benzoilacetonates.

As indicated above, the layered superlattice materials may include metals such as strontium, calcium, barium, bismuth, cadmium, lead, titanium, tantalum, hafnium, tungsten, niobium zirconium, bismuth, scandium, yttrium, lanthanum and the lanthanides, antimony, chromium, molybdenum, vanadium, ruthenium and thallium. Some examples of precursor compounds that may be used for some of these metals are given in Table I.

TABLE 1

| METAL | PRECURSOR FORMULA | CHEMICAL NAME OR NAMES |
|---|---|---|
| Strontium | $Sr(DPM)_2$ | Dipivaloylmethanato strontium or Bis (2,2,6,6,-tetramethyl-3,5-heptanedionato)-strontium or strontium dipivaloylmethanate |
| | $Sr(Cp)_2(THF)_2$ | Bis (pentamethyl-cyclopentadienyl)-bis (tetrahydrofran) strontium |
| | $Sr(DPM)_2(Phen)_2$ | Bis (2,2,6,6,-tetramethyl-3,5-heptanedionato)-bis (1,10-phenanthroline)strontium |
| | $Sr(OEt)_4(dmae)$ | Strontium tetra-ethoxide dimethylaminoethoxide |
| Strontium and Tantalum | $Sr[Ta(OEt)_6]_2$ | Strontium Bis-[tantalum hexa-ethoxide] |
| | $Sr[Ta(iOPr)_6]_2$ | Strontium Bis-[tantalum hexa-iso-propoxide] |
| | $Sr[Ta(OEt)_5(dmae)]_2$ | Strontium Bis-[tantalum penta-ethoxide dimethylaminoethoxide] |
| | $Sr[Ta(OEt)_5(bis-dmae)]_2$ | Strontium Bis-[tantalum penta-ethoxide bis-dimethylaminoethoxide] |
| Bismuth | $BiPh_3$ | Triphenyl bismuth |
| | $Bi(OiPr)_3$ | Triisopropoxy bismuth |
| | $Bi(DPM)_3$ | Bismuth dipivaloylmethanate |
| Tantalum | $Ta(OCH_3)_5$ | Pentamethoxy tantalum |
| | $Ta(OC_2H_5)_5$ | Pentaethoxy tantalum |
| | $Ta(OC_3H_7)_5$ | Pentapropoxy tantalum |
| | $TaCl_5$ | Pentachloro tantalum |

TABLE 1-continued

| METAL | PRECURSOR FORMULA | CHEMICAL NAME OR NAMES |
|---|---|---|
| Niobium | $Nb(OC_2H_5)_5$ | Pentaethoxy niobium |
| | $NbCl_5$ | Pentachloro niobium |
| | $Nb(DPM)_2Cl_3$ | Dipivaloylmethanato trichloro niobium |
| | $Nb(OEt)_4(dmae)$ | Niobium tetra-ethoxide dimethylaminoethoxide |
| Niobium and Tantalum | $Nb[Ta(OEt)_6]_2$ | Niobium Bis-[tantalum hexa-ethoxide] |
| | $Nb[Ta(iOPr)_6]_2$ | Niobium Bis-[tantalum hexa-iso propoxide] |
| Barium | $Ba(DPM)_2$ | Barium dipivaloylmethanate |
| Lead | $Pb(DPM)_2$ | Lead dipivaloylmethanate |
| | $Pb(C_2H_5)_2$ | Diethyl lead |
| Antimony | $Sb(OC_2H_5)_3$ | Triethoxy antimony |
| Titanium | $Ti(OiPr)_2(DPM)_2$ | Diisopropoxy dipivaloylmethanato titanium |
| | $Ti(OiPr)_4$ | Tetraisopropoxy titanium |
| Zirconium | $Zr(DPM)_4$ | Zirconium dipivaloylmethanate |
| Ruthenium | $Ru(DPM)_3$ | Ruthenium dipivaloylmethanate |

In Table I, DPM is $C_{11}H_{19}O_2$, usually called 2,2,6,6,-tetramethyl-3,5-heptanedione.

EXAMPLE 1

Figure 3:
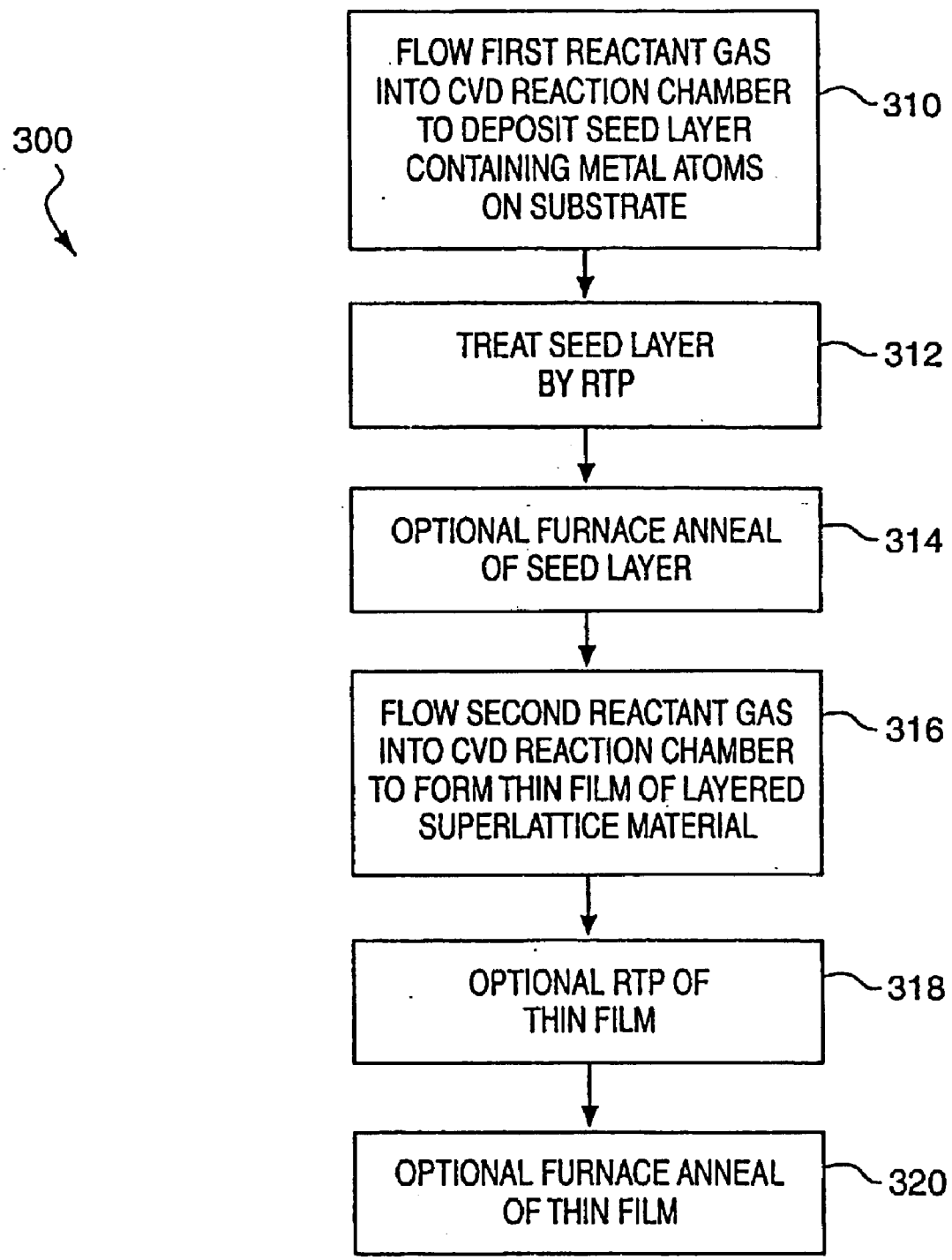
FIG. 3 is a flow chart of a CVD method for depositing a thin film of layered superlattice material in accordance with the invention.
Figure 4:
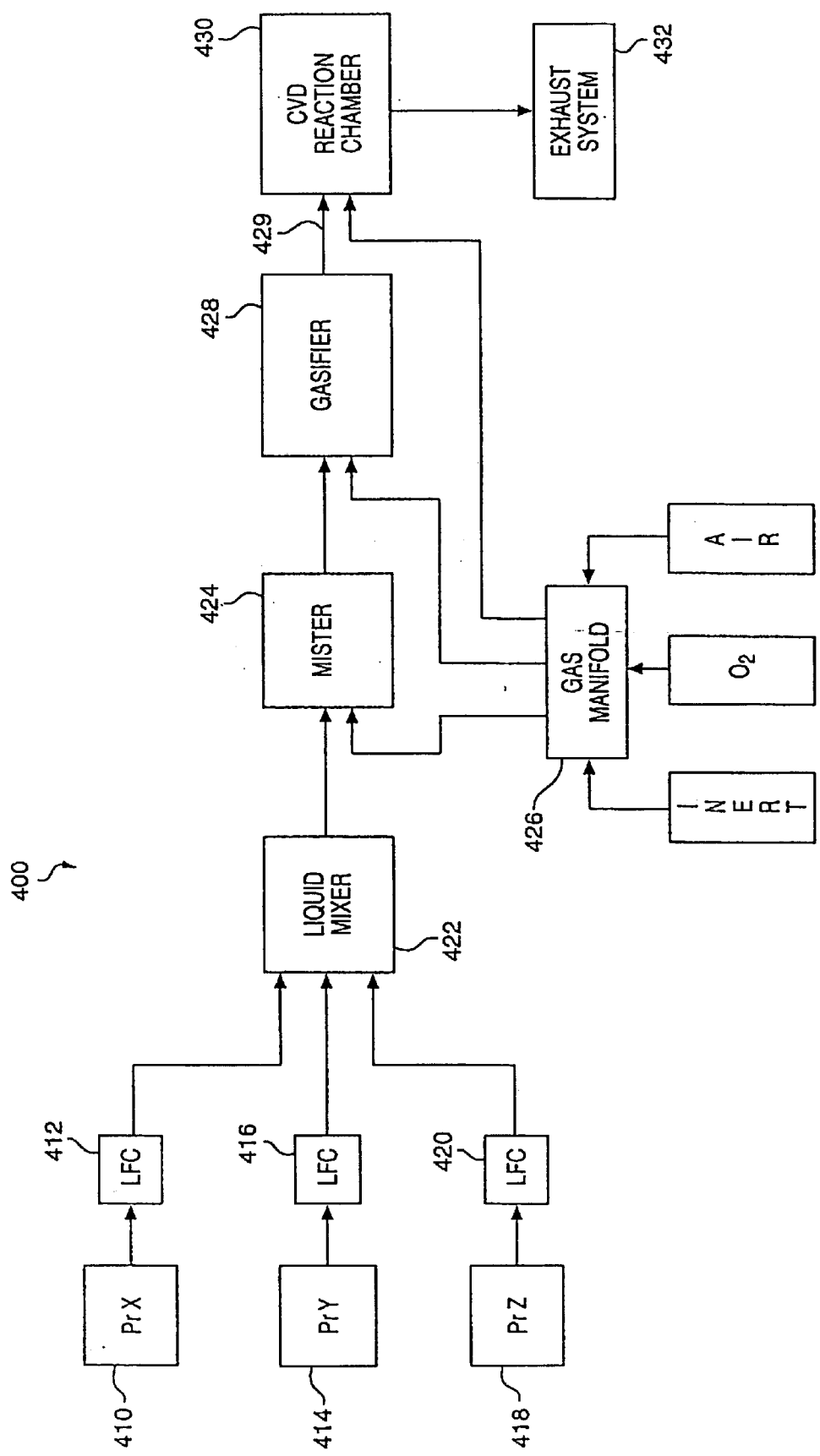
FIG. 4 is a flow diagram of a generalized preferred multisource CVD apparatus for forming a ferroelectric thin film in accordance with the invention.

FIG. 3 depicts a flow chart of an exemplary generalized CVD method 300 in accordance with the invention for preparing a thin film of a layered superlattice material. A flow diagram of a generalized preferred multisource CVD apparatus 400 for forming a ferroelectric thin film in accordance with the invention is shown in FIG. 4. Method 300 of FIG. 3 is discussed herein with reference to FIGS. 4–12 and to the exemplary layered superlattice material strontium bismuth tantalate (SBT), having a stoichiometric formula $SrBi_2Ta_2O_9$. It is clear, however, that the method of FIG. 3 and numerous variations of the method in accordance with the invention may be used to fabricate thin films of polycrystalline layered superlattice materials of other compositions in various types of ferroelectric structures of the integrated circuit art.

Many conventional CVD apparati are suitable for fabricating a thin film of layered superlattice material in accordance with the invention. In a CVD apparatus as represented in FIG. 4, streams of individual liquid precursor solutions having controlled mass flow rates are combined, misted and gasified. By combining the liquid streams and gasifying them together, control of the composition and stoichiometry of the reactant gases is facilitated. Other CVD apparatus may be used in which the gaseous precursor compounds are produced separately and are mixed prior to entering the CVD reaction chamber, or enter the reaction chamber separately through individual gas inlets and are mixed in the reaction chamber itself. Vaporized precursor compounds used in a CVD method of the invention may be generated using a number of varied techniques, including sublimation of a solid compound and bubbling of a carrier gas through a liquid solution. Preferably, one or more liquid MOD precursor solutions, represented by PrX, PrY and PrZ, are prepared and placed in sources 410, 414 and 418 of FIG. 4. Mass flow rates of the liquid precursors into liquid mixer 422 are controlled by liquid flow controllers 412, 416, and 420 so that the precursors can be mixed to form a final liquid precursor mixture. The mixed final precursor liquid is preferably fed into a mister 424, which creates a mist using any suitable misting means, including ultrasound and venturi misting. A carrier gas for creating and carrying the mist is controlled by gas manifold 426. The mist stream flows into a gasifier 428, where the liquid mist particles are gasified, forming a gaseous vapor mixture without causing significant premature reaction of the vaporized precursor compounds. Premature reaction can be avoided: by using inert carrier gas; by forming small particle sizes (in the 0.5–5 micron range), which have a large surface to volume ratio; by keeping short residence times; and by using low gasification temperatures (less than 200° C.). The resulting reactant gas or mixture of reactant gases is fed into CVD reaction chamber 430, where it is mixed with reactive oxygen and reacts at the heated substrate to form a solid film of material. In this disclosure, a reactant gas is at least some portion of a gaseous stream flowing into a CVD reaction chamber. A reactant gas includes carrier gas and one or several vaporized precursor compounds. In addition to the vaporized precursor compounds, a reactant gas typically includes one or more volatilized solvents from one or more vaporized liquid precursor solutions.

Figure 5:
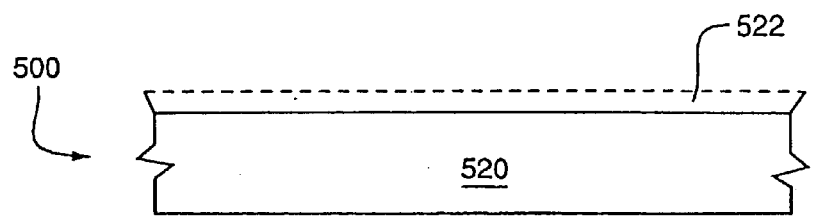
FIG. 5 shows a cross-section of a semiconductor wafer having a heated substrate on which a seed layer of metal-containing material has been deposited.

In step 310, a first reactant gas is flowed into a CVD reaction chamber containing heated integrated circuit wafer 500 having a heated substrate 520, as in FIG. 5. Heated substrate 520 is heated using conventional apparati and techniques. Heated substrate 520 is heated at a first substrate temperature in the range of from 400° C. to 700° C. The first reactant gas contains precursor compounds for strontium, bismuth, and tantalum in proportions corresponding to $SrBi_2Ta_2O_9$ (SBT). In addition to the vaporized precursor compounds, the first reactant gas includes a carrier gas, usually a relatively unreactive gas, such as argon or nitrogen, and volatilized solvent, for example, hexane.

Figure 6:
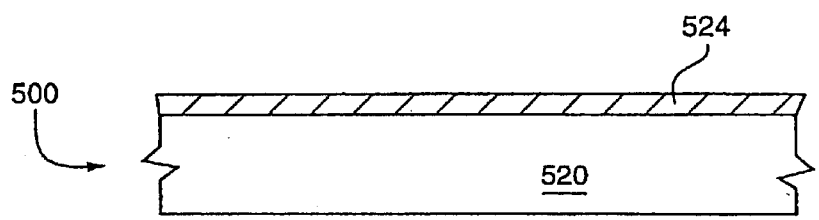
FIG. 6 shows a cross-section of the semiconductor wafer of FIG. 5 in which the seed layer contains crystalline material.

In step 310, a seed layer 522, depicted in FIG. 6, having a thickness of about 25 nm is deposited, which contains metal atoms in molar proportions corresponding to $SrBi_2Ta_2O_9$. A seed layer 522 may be deposited using a reactant gas containing: triphenyl bismuth ($BiPh_3$) as the bismuth precursor compound, at a partial pressure of about 5 torr; strontium dipivaloylmethanate ($Sr[DPM]_2$) as the strontium precursor compound, at a partial pressure of about 50 torr; and tantalum pentaethoxide ($Ta[OEt]_5$) as the tantalum precursor compound, at a partial pressure of about 5 torr.

Figure 7:
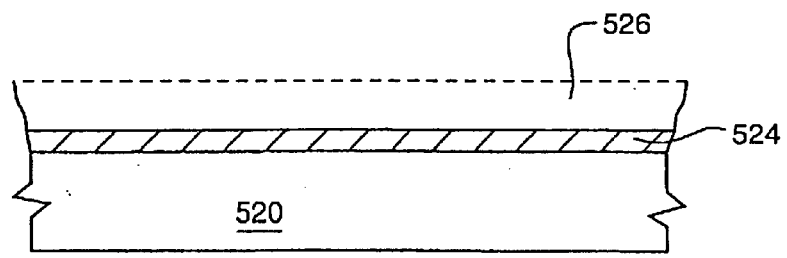
FIG. 7 shows a cross-section of the semiconductor wafer of FIG. 6 on which additional metal atoms have been deposited.
Figure 8:
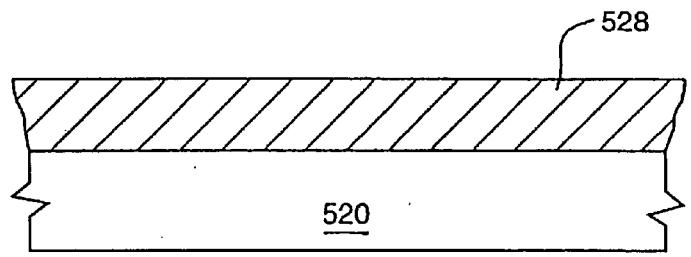
FIG. 8 shows a cross-section of the semiconductor wafer of FIG. 7 on which a thin film of layered superlattice material has been formed.

In step 312, an RTP treatment is conducted to enhance reaction and crystallization for forming seed layer 524, comprising desired strontium bismuth tantalate (SBT) layered superlattice material, as depicted in FIG. 6. Typically, the RTP temperature is ramped at a rate of 1° C. to 300° C. per second, preferably about 200° C. per second, up to a temperature of from 600° C. to 700° C. for a holding period of from 20 seconds to 10 minutes. The RTP conditions are optimized for a particular fabrication process. The RTP step promotes nucleation, i.e. the generation of numerous crystalline grains of the layered superlattice material in seed layer 524. These grains act as nuclei upon which further crystallization can occur as material is deposited in subsequent steps. In optional step 314, a furnace anneal conducted in the range of from 600° C. to 700° C. may be used to enhance desired crystallization of layered superlattice material in seed layer 524. If the first substrate temperature of heated substrate 520 in step 310 is high, in the range of from 600° C. to 700° C., then the RTP step 312 and optional step 314 may be unnecessary for crystallization of seed layer 524. In step 316, a second reactant gas containing strontium, bismuth and tantalum atoms in the same proportions as in the first reactant gas is flowed into the CVD reaction chamber, depositing additional material 526, as depicted in FIG. 7. In step 316, the substrate temperature is in the range of from 400° C. to 700° C., sufficient for reaction and crystallization of the additional material 526 deposited by CVD in step 314, thereby forming the desired thin film 528, FIG. 8, of polycrystalline layered superlattice material having a thickness in the range of from 100 nm to 300 nm, preferably about 200 nm. In step 318, an optional RTP may be performed, especially if the temperature of the substrate in step 316 was less than 600° C. In optional step 320, a furnace anneal may be conducted at a range of from 550° C. to 700° C., preferably at 650° C., for a time in the range of from 30 minutes to 60 minutes.

In a variation of an embodiment in accordance with the invention, the first reactant gas comprises precursor compounds only for the superlattice-forming element bismuth, so that the crystallized seed layer comprises bismuth oxide instead of layered superlattice material.

Figure 9:
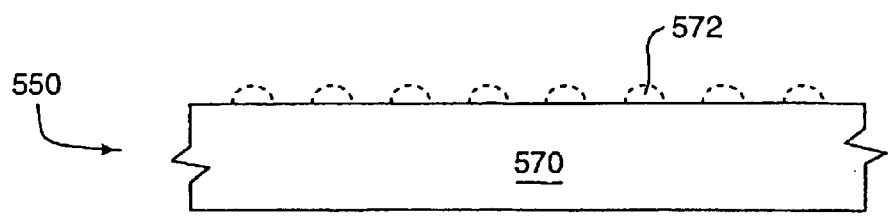
FIG. 9 shows a cross-section of a semiconductor wafer having a heated substrate on which a seed layer comprising islands of metal-containing material has been deposited.
Figure 10:
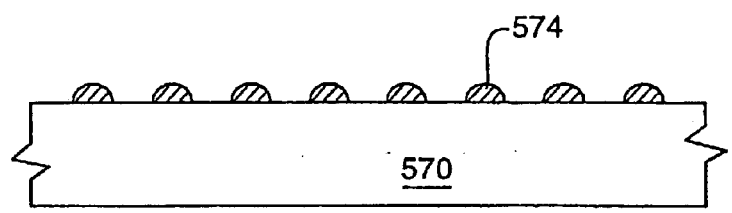
FIG. 10 shows a cross-section of the semiconductor wafer of FIG. 9 in which the islands contain crystalline material.
Figure 11:
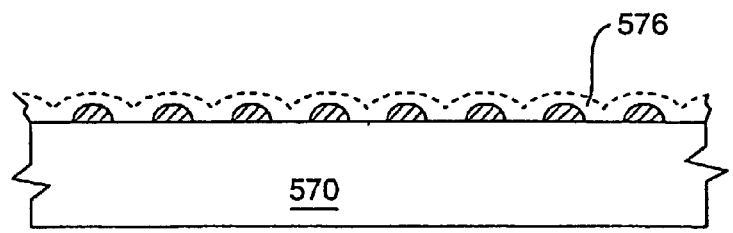
FIG. 11 shows a cross-section of the semiconductor wafer of FIG. 10 on which additional metal atoms have been deposited.
Figure 12:
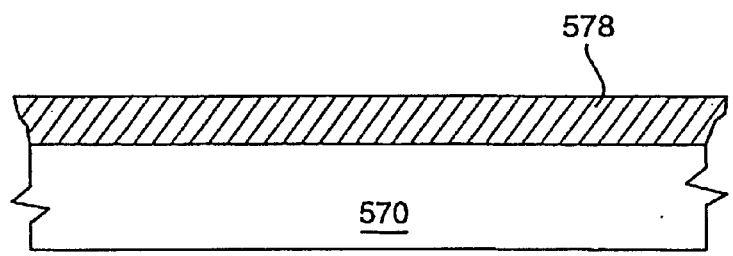
FIG. 12 shows a cross-section of the semiconductor wafer of FIG. 11 on which a thin film of polycrystalline layered superlattice material having large grain size has been formed.

In another variation, a very thin seed layer having a nominal thickness less than 25 nm, preferably about 10 nm, is deposited in step 310. As depicted in FIG. 9, "islands" 572 deposit on substrate 570 of wafer 550, instead of a layer having uniform thickness. In this variation, the typical first substrate temperature of from 600° C. to 700° C. of the heated substrate 570 is typically sufficient to cause reaction and crystallization of the deposited material in islands 572, forming islands 574 of crystalline layered superlattice material, as depicted in FIG. 10. Then additional material 576, FIG. 11, is deposited in step 316 on heated substrate 570 at a second substrate temperature that is about from 10° C. to 100° C. lower than the first substrate temperature. The presence of the crystalline islands 574 and the heat of the heated substrate are typically sufficient for reaction and crystallization of polycrystalline layered superlattice material in thin film 578, FIG. 12, having increased grain size.

EXAMPLE 2

Figure 13:
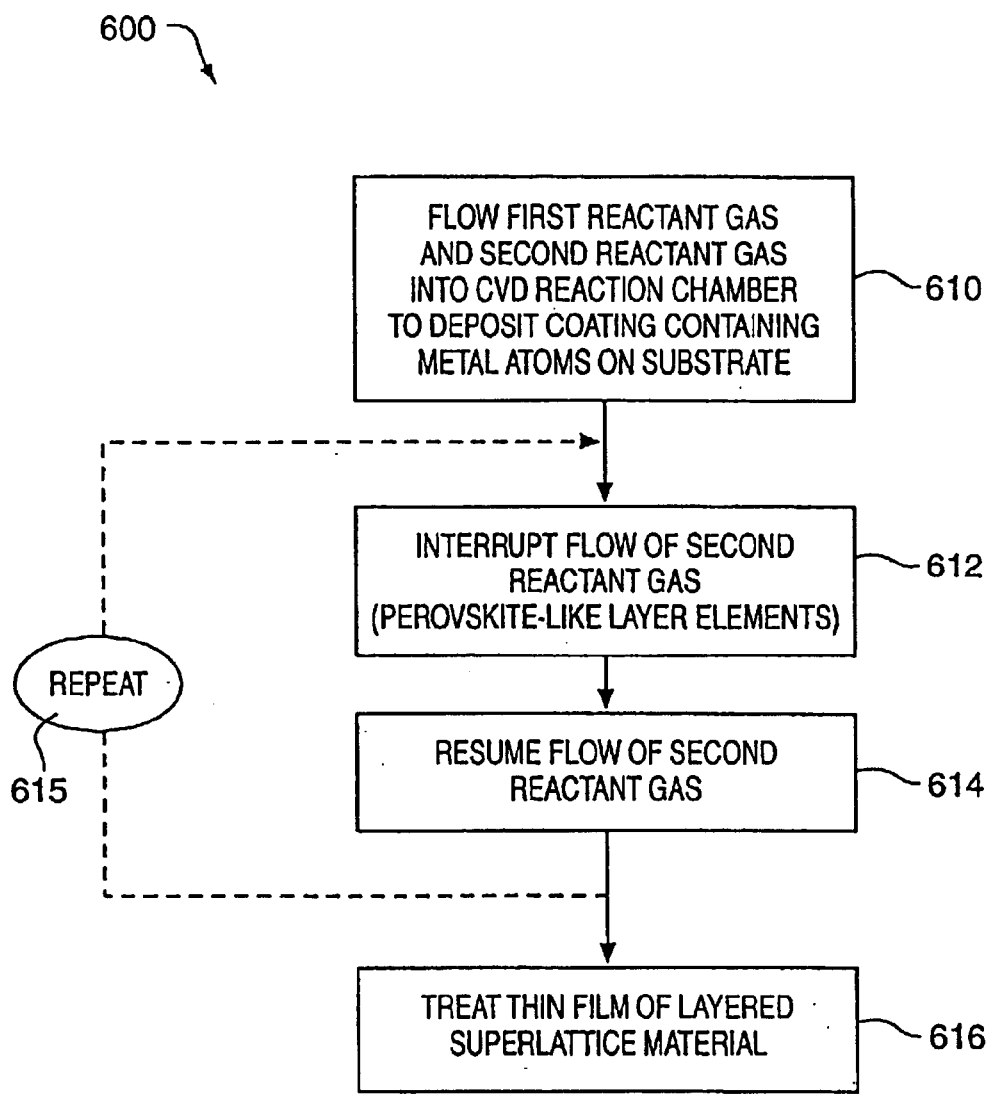
FIG. 13 is a flow chart of a CVD method for depositing a thin film of layered superlattice material in accordance with the invention.
Figure 14:
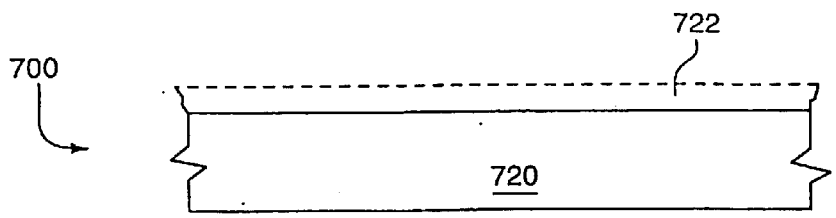
FIG. 14 shows a cross-section of a semiconductor wafer having a heated substrate on which a coating containing metals for forming layered superlattice material has been deposited.
Figure 15:
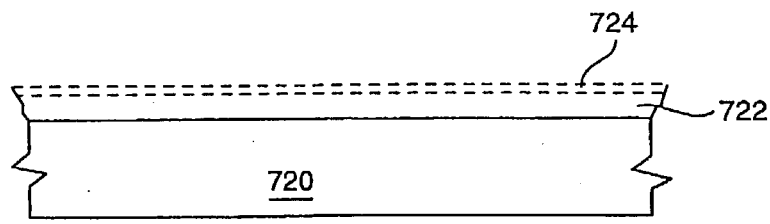
FIG. 15 shows a cross-section of the semiconductor wafer of FIG. 14 in which material containing superlattice generator atoms has been deposited.

Another exemplary embodiment in accordance with the invention is represented in the flow sheet of generalized method 600, depicted in FIG. 13. Method 600 of FIG. 13 is discussed herein with reference to FIGS. 14–17 and to the exemplary layered superlattice material strontium bismuth tantalate (SBT), having a stoichiometric formula $SrBi_2Ta_2O_9$. It is clear, however, that method 600 of FIG. 13 and numerous variations of the method in accordance with the invention may be used to fabricate thin films of polycrystalline layered superlattice materials of other compositions in various types of ferroelectric structures of the integrated circuit art. In step 610, a first reactant gas, containing the superlattice-generator element bismuth, is flowed into a CVD reaction chamber containing heated substrate 720 of wafer 700, depicted in FIG. 14. At the same time, a second reactant gas, containing perovskite-like-layer-elements strontium and tantalum, is flowed into the CVD reaction chamber. The first and second reactant gases may be flowed in the same gaseous stream, or they may be flowed separately. In step 610, a coating 722 containing metal atoms in molar proportions corresponding to the stoichiometric formula $SrBi_2Ta_2O_9$ is deposited. Coating 722 typically has a thickness in the range of from 5 nm to 40 nm, preferably about 30 nm. In step 612, the flow of the second reactant gas is interrupted for a predetermined time period, long enough to deposit additional material in coating 724, depicted in FIG. 15, containing bismuth atoms, but no perovskite-layer-forming elements strontium and tantalum. Coating 724 has a thickness about the same as coating 722. In step 614, the flow of the second reactant gas is resumed, so that a coating 726 containing atoms in stoichiometric proportions suitable for forming $SrBi_2Ta_2O_9$ is deposited.

Figure 16:
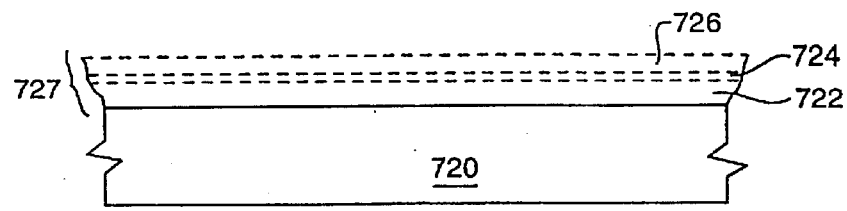
FIG. 16 shows a cross-section of the semiconductor wafer of FIG. 15 on which additional material containing metals for forming layered superlattice material has been deposited.
Figure 17:
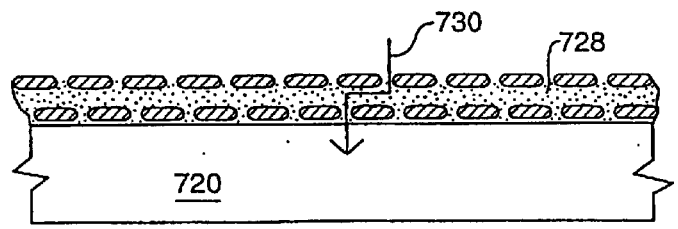
FIG. 17 shows a cross-section of the semiconductor wafer of FIG. 16 on which a thin film of polycrystalline layered superlattice material having increased grain boundaries and longer charge leakage path has been formed.
Figure 18:
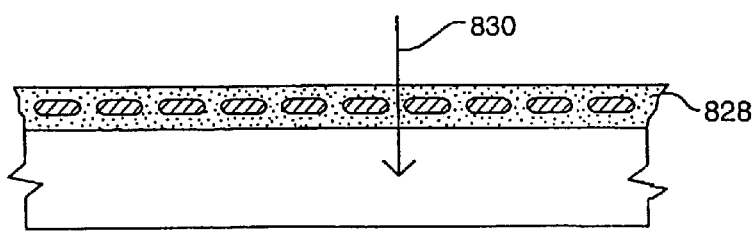
FIG. 18 shows a cross-section of the semiconductor wafer having a thin film of layered superlattice material made using conventional methods has a shorter charge leakage path as the thin film in FIG. 17.

The sequence can be repeated, step 615, until an aggregate coating 727, FIG. 16, having a final thickness corresponding to the desired thickness of the final thin film, is reached. If the temperature of the heated substrate is high, in the range of from 600° C. to 700° C., then the heat is probably sufficient to cause reaction and crystallization of the deposited material in aggregate layer 727 to form the desired thin film 728 of polycrystalline layered superlattice material, FIG. 17. If the substrate temperature is below 600° C., then treatment by RTP furnace annealing may be necessary or advantageous. As a result of the sequence represented by steps 612 and 614, the grain boundaries between the individual crystalline grains of polycrystalline thin film 728 are increased in size and complexity compared with the grain boundaries in thin films of layered superlattice material formed without the interruptions of step 612. Line 730 of FIG. 17 represents the longer and more circuitous path of leakage charges in a thin film in accordance with the invention, compared to the shorter and more direct path 830 of leakage current in a conventionally formed thin film 828, depicted in FIG. 18.

Terms such as "heating", "baking", "rapid thermal process" ("RTP"), "annealing", and others involve the application of heat. For the sake of clarity, the various terms are used to distinguish certain techniques and method steps from one another. Nevertheless, it is clear that similar techniques may be used to accomplish differently named process steps; for example, baking and annealing typically may be accomplished using the same apparatus, the only differences being their function and position in a fabrication sequence, or the particular temperatures used. As a result, it would be possible to designate an annealing step as a heating step or a baking step. It is understood, therefore, that one skilled in the art may accomplish a desired process result using heat as disclosed herein, while referring to the process with a term different from the one used herein.

Radiation from a halogen lamp, an infrared lamp, or an ultraviolet lamp provides the source of heat for RTP steps. Preferably, RTP is performed in an oxygen-containing gas, most preferably in substantially pure $O_2$ gas. Any residual organics are burned out and vaporized during the RTP process. At the same time, the rapid temperature rise of the RTP promotes nucleation; that is, the generation of numerous crystalline grains of the layered superlattice material in the solid film produced by the baking and RTP of the precursor coating. These grains act as nuclei upon which further crystallization can occur. The presence of oxygen in the RTP process enhances formation of these grains.

There has been described a CVD process for making electronic devices utilizing layered superlattice materials. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. It is also evident that the steps recited may in some instances be performed in a different order; or equivalent structures and processes may be substituted for the various structures and processes described; or a variety of different precursors may be used. Consequently, the invention is to be construed as embracing each and every novel feature and novel combination of features present in and/or possessed by the fabrication processes, electronic devices, and electronic device manufacturing methods described.

We claim:

1. A method of forming a thin film of layered superlattice material of an integrated circuit, said method comprising steps of:

flowing both a first reactant gas and a second reactant gas into a CVD reaction chamber containing a heated substrate to deposit a coating containing metal atoms on said heated substrate, said first reactant gas containing a superlattice-generator-element and said second reactant gas containing a perovskite-like-layer-element;

interrupting said flowing of said second reactant gas for a predetermined time period while flowing said first reactant gas; and resuming said flowing of said second reactant gas.

2. A method as in claim 1 wherein said heated substrate is heated at a temperature in a range of from 400° C. to 700° C.

3. A method as in claim 1 wherein said predetermined time period is in a range of from 10 seconds to 10 minutes.

4. A method as in claim 3 wherein said predetermined time period does not exceed 1 minute.

5. A method as in claim 1 further comprising interrupting said flowing of said first reactant gas during said interrupting said flowing of said second reactant gas, and further comprising resuming said flowing of said first reactant gas.

6. A method as in claim 1 wherein said first reactant gas and said second reactant gas together contain stoichiometric amounts of metal atoms suitable for forming said layered superlattice material.

7. A method as in claim 1 wherein said first reactant gas contains bismuth.

8. A method as in claim 1 wherein said first reactant gas and said second reactant gas together contain stoichiometric amounts of strontium, bismuth, tantalum and niobate for forming said layered superlattice material.

9. A method as in claim 1 wherein said thin film contains amounts of strontium, bismuth, tantalum and niobate in proportions corresponding to a general stoichiometric formula $SrBi_2(Ta_{1-x}Nb_x)_2O_9$, where $0 \leq x \leq 1$.

10. A method as in claim 1 wherein said thin film contains amounts of strontium, bismuth, tantalum and niobate in proportions corresponding to a general stoichiometric formula $Sr_aBi_b(Ta_cNb_d)O_{[9+(a-1)+(b-2)(1.5)+(c+d-2)(2.5)]}$, where $0.8 \leq a \leq 1, 2 \leq b \leq 2.2, 0 \leq d \leq 1$ and $1.9 \leq (c+d) \leq 1$.

11. A method as in claim 1 further comprising a step of treating said thin film of layered superlattice material.

12. A method as in claim 11 wherein said step of treating said thin film includes rapid thermal processing said thin film.

13. A method as in claim 12 wherein said rapid thermal processing said thin film is conducted at a temperature in a range of from 600° C. to 700° C.

14. A method as in claim 13 wherein said rapid thermal processing said thin film is conducted for a time period in a range of from 30 seconds to 10 minutes.

15. A method as in claim 11 wherein said step of treating said thin film includes furnace annealing said thin film.

16. A method as in claim 15 wherein said furnace annealing said thin film is conducted at a temperature in a range of from 600° C. to 700° C.

17. A method as in claim 16 wherein said furnace annealing said thin film is conducted for a time period in a range of from 10 minutes to 30 minutes.

* * * * *